United States Patent
Cevrero et al.

(10) Patent No.: US 10,236,840 B1
(45) Date of Patent: Mar. 19, 2019

(54) TRANSADMITTANCE AMPLIFIER

(71) Applicant: International Business Machines Corporation, Armonk, NY (US)

(72) Inventors: Alessandro Cevrero, Oberrieden (CH); Ilter Özkaya, Adliswil (CH); Thomas H. Toifl, Gattikon (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/702,785

(22) Filed: Sep. 13, 2017

(51) Int. Cl.
  *H03F 3/45* (2006.01)
  *H03F 3/30* (2006.01)
  *H04B 10/69* (2013.01)

(52) U.S. Cl.
  CPC ....... *H03F 3/3028* (2013.01); *H04B 10/6971* (2013.01); *H03F 3/45071* (2013.01); *H03F 3/45179* (2013.01); *H03F 3/45183* (2013.01); *H03F 2203/30061* (2013.01)

(58) Field of Classification Search
  CPC ...... H03F 3/3028; H03F 3/45; H03F 3/45174; H03F 3/45273; H03F 3/45372; H03F 3/4547; H03F 2203/45054; H03F 2203/45096; H03F 2203/45124; H03F 3/45071; H03F 3/45183; H03F 3/45085; H04B 10/6971
  USPC ................................................. 330/253, 257
  See application file for complete search history.

(56) References Cited

U.S. PATENT DOCUMENTS

| | | | |
|---|---|---|---|
| 5,717,360 A | 2/1998 | Vu et al. | |
| 7,768,351 B2* | 8/2010 | Ivanov | H03F 3/45179 330/255 |
| 7,868,695 B2* | 1/2011 | Ishiguro | H03F 3/45183 330/253 |
| 8,803,609 B2 | 8/2014 | Kao et al. | |
| 9,184,957 B2 | 11/2015 | Chang et al. | |
| 2005/0200411 A1* | 9/2005 | Chang | H03F 3/45183 330/253 |

(Continued)

OTHER PUBLICATIONS

Balan et al., "A 15-22 Gbps Serial Link in 28 nm CMOS With Direct DFE", IEEE Journal of Solid-State Circuits, vol. 49, No. 12, Dec. 2014, 12 pages.

(Continued)

*Primary Examiner* — Khanh V Nguyen
(74) *Attorney, Agent, or Firm* — Gilbert Harmon, Jr.

(57) ABSTRACT

Embodiments describe a transadmittance amplifier comprising an inverting output port and a non-inverting output port. The transadmittance amplifier comprising a first differential transistor pair having a first transistor comprising an inverting input port. The first transistor is configured to provide an output current to the inverting output port. A second transistor comprising a non-inverting input port. The second transistor is configured to provide an output current to the non-inverting output port. A second differential transistor pair having a third transistor comprising an inverting input port and a fourth transistor comprising a non-inverting input port. A first current source and a second current source. The transadmittance amplifier comprises a first current mirror which is configured to mirror an output current of the fourth transistor to the inverting output port and a second current mirror which is configured to mirror an output current of the third transistor to the non-inverting output port.

15 Claims, 5 Drawing Sheets

(56) References Cited

U.S. PATENT DOCUMENTS

2011/0227649 A1    9/2011  Montalvo
2016/0006403 A1*   1/2016  Ivanov ................ H03F 3/45183
                                                              330/2

OTHER PUBLICATIONS

Kimura et al., "A 28 Gb/s 560 mW Multi-Standard SerDes With Single-Stage Analog Front-End and 14-Tap Decision Feedback Equalizer in 28 nm CMOS", IEEE Journal of Solid-State Circuits, vol. 49, No. 12, Dec. 2014, 13 pages.

* cited by examiner

TRANSADMITTANCE AMPLIFIER

BACKGROUND OF THE INVENTION

The present invention relates to a transadmittance amplifier.

The invention further relates to a corresponding transadmittance-transimpedance amplifier, a corresponding optical receiver, a corresponding method and a corresponding design structure.

Transadmittance amplifiers, which can be also denoted as transconductance amplifiers, are circuits that generate an output current that is a function of the difference between two input voltages.

Transadmittance amplifiers are e.g. widely used in optical receivers, in particular in variable gain amplifiers (VGA) of optical receivers. The VGA of an optical receiver has the function to amplify the output signal of the transimpedance amplifier (TIA) which has converted the photo current into a voltage. More particularly, the VGA should provide enough swing for a subsequent comparator stage to resolve the analog signal in the given cycle time.

Furthermore, the VGA should provide enough gain with high bandwidth to avoid additional intersymbol interference (ISI).

SUMMARY

According to a first aspect, the present invention is embodied as a transadmittance amplifier comprising an inverting output port and a non-inverting output port. The transadmittance amplifier further comprises a first differential transistor pair having a first transistor comprising an inverting input port. The first transistor is configured to provide an output current to the inverting output port. The first differential transistor pair further comprises a second transistor comprising a non-inverting input port. The second transistor is configured to provide an output current to the non-inverting output port. The transadmittance amplifier further comprises a second differential transistor pair having a third transistor comprising an inverting input port and a fourth transistor comprising a non-inverting input port. Furthermore, a first current source is configured to apply a first biasing current having a first current intensity to the first differential transistor pair and a second current source is configured to apply a second biasing current having a second current intensity to the second differential transistor pair. Furthermore, the transadmittance amplifier comprises a first current mirror which is configured to mirror an output current of the fourth transistor to the inverting output port and a second current mirror which is configured to mirror an output current of the third transistor to the non-inverting output port.

According to another aspect, the invention is embodied as a method for converting a differential input voltage to a differential output current by means of a transadmittance amplifier of the first aspect. The method comprises steps of providing an output current of the first transistor to the inverting output port and providing an output current of the second transistor to the non-inverting output port. The method comprises further steps of applying, by a first current source, a first biasing current having a first current intensity to the first differential transistor pair and applying, by a second current source, a second biasing current having a second current intensity to the second differential transistor pair. The method comprises further steps of mirroring, by a first current mirror, an output current of the fourth transistor to the inverting output port and mirroring, by a second current mirror, an output current of the third transistor to the non-inverting output port.

According to yet another aspect, the invention can be embodied as a design structure tangibly embodied in a machine readable medium for designing, manufacturing, or testing an integrated circuit. The design structure comprises a transadmittance amplifier according to the first aspect.

Devices and methods embodying the present invention will now be described, by way of non-limiting examples, and in reference to the accompanying drawings. Technical features depicted in the drawings are not necessarily to scale. Also some parts can be depicted as being not in contact to ease the understanding of the drawings, whereas they can very well be meant to be in contact, in operation.

DETAILED DESCRIPTION OF THE INVENTION

Figure 1:
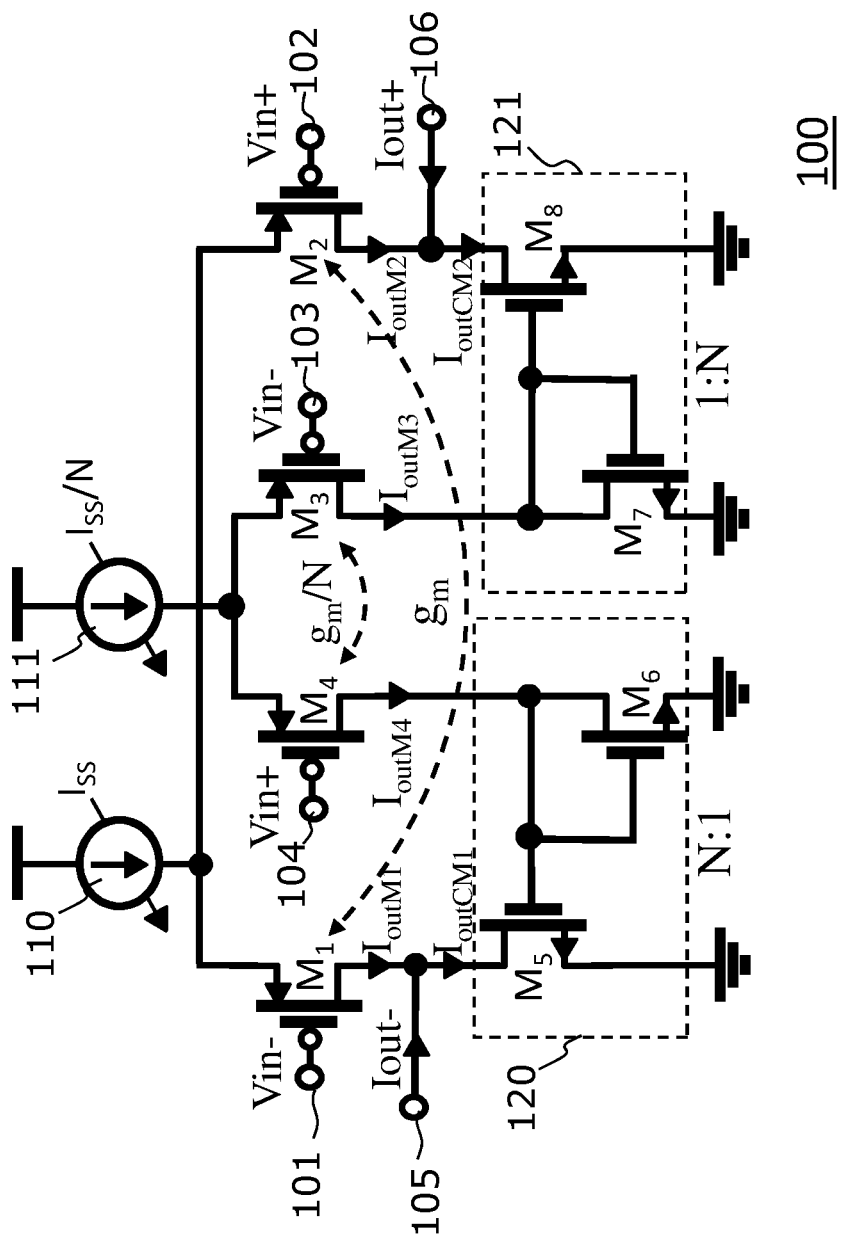
FIG. 1 shows a schematic block diagram of an exemplary embodiment of a transadmittance amplifier.

FIG. 1 shows a schematic block diagram of an exemplary embodiment of a transadmittance amplifier 100. FIG. 1 provides only an illustration of one implementation and does not imply any limitations with regard to the environments in which different embodiments can be implemented. Many modifications to the depicted environment can be made by those skilled in the art without departing from the scope of the invention as recited by the claims.

The transadmittance amplifier 100 comprises a first transistor M1 which has an inverting input port 101. The transadmittance amplifier 100 further comprises a second transistor M2 which has a non-inverting input port 102, wherein the first transistor M1 and the second transistor M2 are coupled to transadmittance amplifier 100. The first transistor M1 and the second transistor M2 form a first differential transistor pair. In various embodiments, the first transistor M1 and the second transistor M2 are coupled to opposite sides of transadmittance amplifier 100. In other embodiments, the first transistor M1 and the second transistor M2 are coupled adjacent to each other on transadmittance amplifier 100.

The transadmittance amplifier 100 further comprises a third transistor M3 with an inverting input port 103 and a fourth transistor M4 comprising a non-inverting input port 104. The third transistor M3 and the fourth transistor M4 form a second differential transistor pair.

The transadmittance amplifier 100 further comprises an inverting output port 105 and a non-inverting output port 106. The first transistor M1 provides an output current $I_{outM1}$ to the inverting output port 105. Furthermore, the second transistor M2 provides an output current $I_{outM2}$ to the non-inverting output port 106.

The transadmittance amplifier 100 further comprises a first current source 110 embodied as programmable current source and configured to apply a first biasing current ($I_{SS}$) having a first current intensity to the first differential transistor pair M1, M2. The transadmittance amplifier 100 further comprises a second current source 111 embodied as programmable current source and configured to apply a second biasing current ($I_{SS}/N$) having a second current intensity to the second differential transistor pair M3, M4. N can be any real number greater or equal to 1. According to preferred embodiments N is a real number between 2 and 8. Hence by applying appropriate biasing currents, the transadmittance amplifier 100 can be configured with a predefined ratio N of the first current intensity to the second current intensity.

The transadmittance amplifier 100 further comprises a first current mirror 120 and a second current mirror 121. The first current mirror 120 is configured to mirror an output current $I_{outM4}$ of the fourth transistor M4 to the inverting output port 105 of the transadmittance amplifier 100. The second current mirror 121 is configured to mirror an output current $I_{outM3}$ of the third transistor M3 to the non-inverting output port 106 of the transadmittance amplifier 100. More particularly, the first current mirror 120 is configured to mirror the output current $I_{outM4}$ of the fourth transistor M4 with a mirror ratio of 1:N to the inverting output port 105. Correspondingly, the second current mirror 121 is configured to mirror the output current $I_{outM3}$ of the third transistor M3 also with a mirror ratio of 1:N to the non-inverting output port 106.

The output currents can be expressed as Iout−=$I_{outCM1}$−$I_{outM1}$ and Iout+=$I_{outCM2}$−$I_{outM2}$. Hence for the zero input case (Vin−=Vin+) both output currents are equal to zero.

The gain of the transadmittance stage is doubled when compared with corresponding transadmittance amplifier's that do not comprise the circuit elements of the second current source 111, the second differential transistor pair M3, M4 and the first and the second current mirror 120, 121.

The first current mirror 120 comprises a pair of transistors M5 and M6 and the second current mirror comprises a pair of transistors M7 and M8. The gate of the transistor M6 is coupled with the gate of transistor M5 and the drain of the transistor M6. In various embodiments, the gate of the transistor M7 is coupled with both the gate of transistor M8 and the drain of the transistor M7. According to other embodiments, other current mirror circuits than the one shown in FIG. 1 can be used. In particular, according to other embodiments a peaking resistor $R_p$ can be provided between the gate of the transistor M6 and the gate of transistor M5, which is coupled to the drain of transistor M6. Correspondingly, a peaking resistor $R_p$ can be provided between the gate of the transistor M7 and the gate of transistor M8, which is coupled to the drain of transistor M7. Such peaking resistors can contribute to a bandwidth enhancement.

In various embodiments, the mirror ratios of the current mirrors 120, 121 can can be designed by the channel width w of the respective transistors M5, M6, M7 and M8. In particular the channel width w of the transistors M5 and M8 can be chosen to be N times wider than the channel width of the transistors M6 and M7 to achieve a mirror ratio of 1:N.

Such a current mirror topology provides the advantage that it boosts the transconductance $g_m$ of the transadmittance amplifier 100 as will be described in more detail below.

Inverting input port 101 of the first transistor M1 and inverting input port 103 of the third transistor M3, respectively commonly form an inverting input port of the transadmittance amplifier 100. More particularly, the inverting input port 101 of the first transistor M1 and inverting input port 103 of the third transistor M3 respectively are shorted by a low-ohmic path, wherein both inverting input port 101 of the first transistor M1 and inverting input port 103 of the third transistor M3 are configured to receive a first (inverting) voltage input signal Vin−. Correspondingly, the non-inverting input ports 102 and 104 of the second transistor M2 and the fourth transistor M4 respectively commonly form a non-inverting input port of the transadmittance amplifier 100. More particularly, the non-inverting input ports 102 and 104 of the second transistor M2 and the fourth transistor M4 respectively are shorted by a low-ohmic path and both configured to receive a second (non-inverting) voltage input signal Vin+.

Hence the transadmittance amplifier 100 is a fully differential amplifier having a differential input port formed by the inverting input ports 101 and 103 and the non-inverting input ports 102 and 104. Furthermore, it has a differential output port formed by the inverting output port 105 and the non-inverting output port 106.

In exemplary embodiments, the first transistor M1, the second transistor M2, the third transistor M3 and the fourth transistor M4 are embodied as p-type field effect transistors (p-FET).

In more detail, the source of the first transistor M1 and the source of the second transistor M2 are coupled, in particular shorted, to each other. Furthermore, the first current source 110 is coupled to the source of the first transistor M1 and to the source of the second transistor M2 to be biased by the biasing current ISS. The second current source 111 is coupled to the source of the third transistor M3 and to the source of the fourth transistor M4 to be biased by the biasing current ISS/N.

The drain of the first transistor M1 and the drain of the fourth transistor M4 are coupled via the first current mirror 120 to each other. The drain of the second transistor M2 and the drain of the third transistor M3 are coupled via the second current mirror 121 to each other. The drain of the first transistor M1 is coupled to the inverting output port 105 and the drain of the second transistor M2 is coupled to the non-inverting output port 106. The gate of the first transistor M1 forms the inverting input port 101 of the first transistor M1. The gate of the second transistor M2 forms the non-inverting input port 102 of the second transistor M2. The gate of the third transistor M3 forms the inverting input port 103 of the third transistor M3 and the gate of the fourth transistor M4 forms the non-inverting input port 104 of the fourth transistor M4.

The first transistor M1 and the second transistor M2 are designed to have the same transconductance value $g_m$. Furthermore, the transadmittance amplifier 100 is designed such that transconductance value of the third transistor M3 and the fourth transistor M4 is a fraction 1/N of the transconductance value $g_m$ of the first and the second transistor M1, M2. This can be achieved by choosing an appropriate channel width w of the respective transistors. More particularly, assuming that the first transistor M1 and the second transistor M2 have a channel width $w_1$, the width $w_2$ of the third transistor M3 and the fourth transistor M4 is chosen to be $w_2=w_1/N$.

Generally the transconductance value $g_m$ is proportional to the square root of (w·I)/L as given by Equation 1:

$$g_m \sim \sqrt{\frac{wI}{L}} \qquad \text{Equation 1}$$

wherein w is the channel width of the field effect transistors (FET), L the gate length and I the source-drain current of the respective transistor.

Hence, assuming the same gate length L for the transistors M1, M2, M3 and M4, a reduced channel width $w_2 = w_1/n$ of the transistors M3, M4 and a second biasing current of $I_{ss}/N$, the transconductance value $g_{m1}$ of the first transistor M1 and the second transistor M2 is N times greater than the transconductance value $g_{m2}$ of the third transistor M3 and the fourth transistor M4.

As a result, by providing the second differential transistor pair M3, M4 with the second current source 111 and the current mirrors 120, 121, the transconductance value $g_m$ of the transadmittance amplifier 100 can be boosted by 2 times compared with a transadmittance amplifier without these additional components. This comes with a rather small load penalty of 1/N. More particularly, the power of the transadmittance amplifier 100 is proportional to the first biasing current $I_{SS}$ and the second biasing current $I_{SS}/N$ and hence proportional to (1+1/N). According to preferred embodiments 2≤N≤8. According to a preferred embodiment, N=4. According to this embodiment, boosting the transconductance value $g_m$ by 2 times comes with an additional power consumption of 25%. According to embodiments N can be chosen in accordance with a respective bandwidth target of the amplifier.

It should be noted that also n-type FET can be used to implement a transadmittance amplifier according to other embodiments of the invention. Furthermore, according to yet other embodiments, bipolar transistors can be used.

Figure 2:
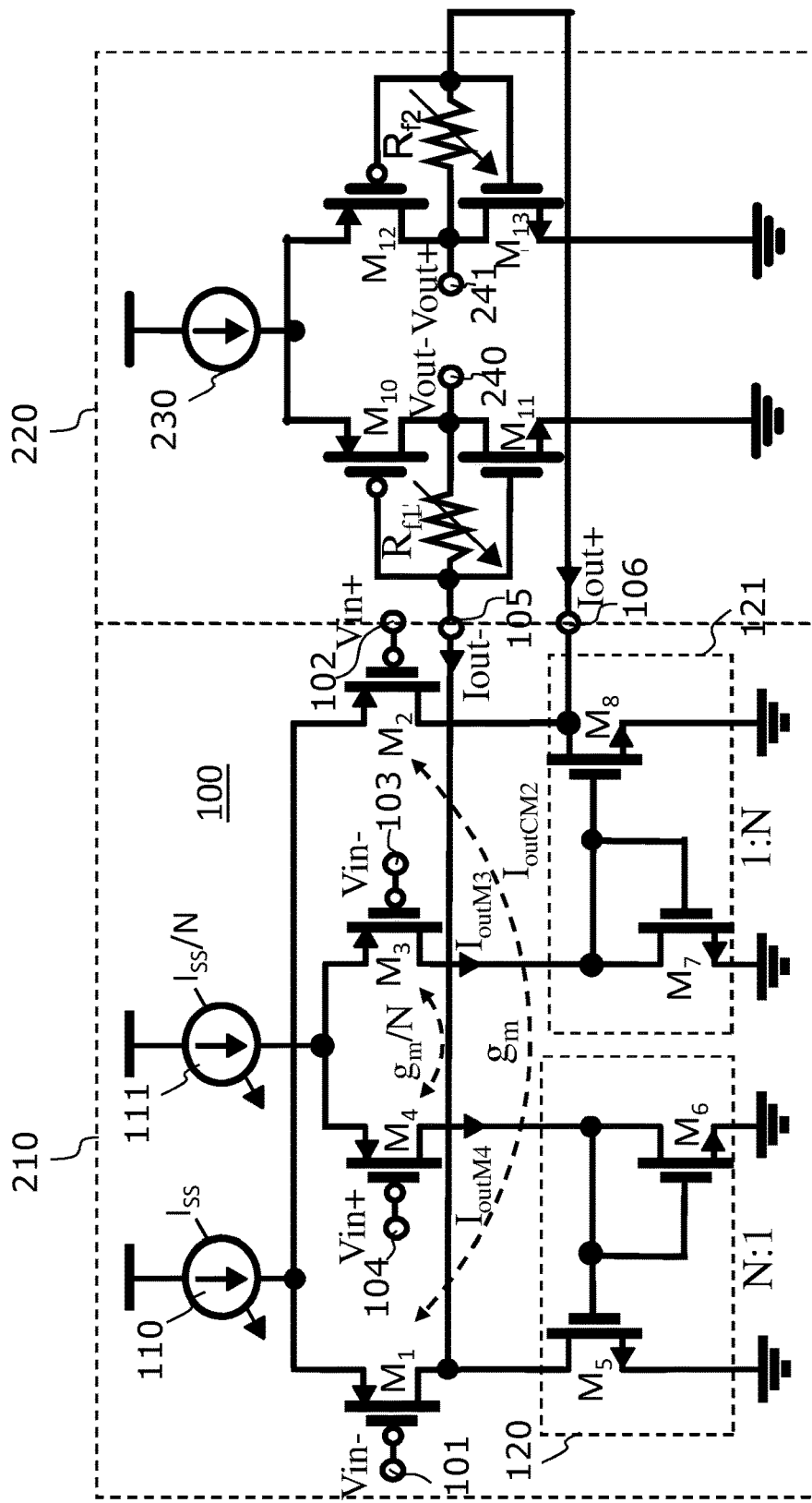
FIG. 2 shows a transadmittance-transimpedance amplifier comprising the transadmittance amplifier of FIG. 1.

FIG. 2 shows a transadmittance-transimpedance amplifier 200 according to an embodiment of the invention.

The transadmittance-transimpedance amplifier 200 comprises a transadmittance stage 210 comprising the transadmittance amplifier 100 as described with reference to FIG. 1. Furthermore, it comprise a transimpedance stage 220. The transimpedance stage 220 is configured to convert the differential output currents Iout+, Iout− of the transadmittance amplifier 100 into differential output voltages Vout+, Vout−.

The transimpedance stage 220 is embodied as a differential push-pull amplifier. It comprises a first set of push-pull transistors M10, M11 and a second set of push-pull transistors M12, M13.

Furthermore, the transimpedance stage 220 comprises a third current source 230 which can also be embodied as programmable current source.

In addition, a pair of feedback resistors is provided comprising a first feedback resistor $R_{f1}$ and a second feedback resistor $R_{f2}$. The first feedback resistor $R_{f1}$ is coupled between an inverting output port 240 of the transimpedance stage and the inverting output port 105 of the transadmittance amplifier 100. The second feedback resistor $R_{f2}$ is coupled between a non-inverting output port 241 of the transimpedance stage 220 and the non-inverting output port 106 of the transadmittance amplifier 100.

The first feedback resistor $R_{f1}$ and the second feedback resistor $R_{f2}$ are tunable to tune a driving capability of the transadmittance-transimpedance amplifier 200.

The transadmittance-transimpedance amplifier 200 can also be denoted as Cherry-Hooper amplifier. As described above, the transadmittance-transimpedance amplifier 200 is a cascading combination of the transadmittance amplifier 100 with the transimpedance stage (TIS) 220.

According to embodiments as described above, the second differential transistor pair M3, M4 with the second current source 111 and the current mirrors 120, 121 boosts the transconductance $g_m$ of the TAS stage 210 by a factor of 2. Hence according to embodiments the resistance values of the first feedback resistor $R_{f1}$ and the second feedback resistor $R_{f2}$ can be halved, thereby improving the driving capability of the transadmittance-transimpedance amplifier 200. More particularly, the gain G of the transadmittance amplifier 100 can be calculated using Equation 2:

$$G = 2 g_m R_f,  \quad \text{Equation 2}$$

wherein $R_f$ is the common resistance value of the first feedback resistors $R_{f1}$ and the second feedback resistor $R_{f2}$ and $g_m$ is the transconductance value of a transadmittance amplifier comprising only the first differential transistor pair M1, M2 with the first current source 110, but without the additional circuitry encompassing the second differential transistor pair M3, M4, the second current source 111 and the current mirrors 120, 121.

Figure 3:
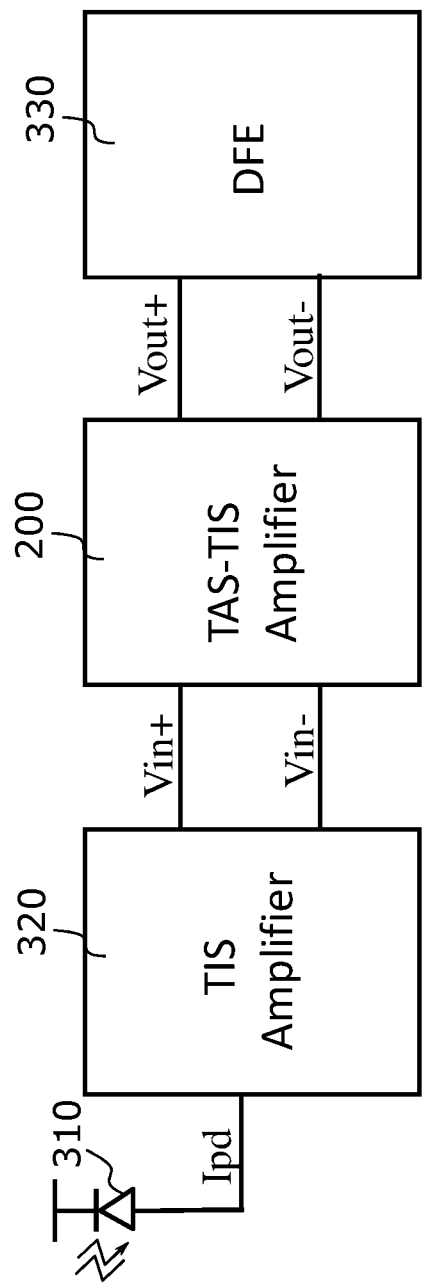
FIG. 3 shows an optical receiver comprising the transadmittance-transimpedance amplifier of FIG. 2.

FIG. 3 shows an optical receiver 300 comprising the transadmittance-transimpedance amplifier 200 as illustrated with reference to FIG. 2.

The optical receiver 300 further comprises a photodiode 310, a transimpedance amplifier 320, and a digital feedback equalizer (DFE) 330. The digital feedback equalizer 330 is configured to receive the differential output signal Vout+, Vout− of the transadmittance-transimpedance amplifier 200.

The photodiode 310 is configured to receive an optical input signal and to convert it into a photodiode-current (Ipd). The photodiode current (Ipd) is then supplied to the transimpedance amplifier 320 which converts it into a differential output voltage Vin+, Vin−. This differential output voltage Vin+, Vin− is then supplied to the transadmittance-transimpedance amplifier 200.

Figure 4:
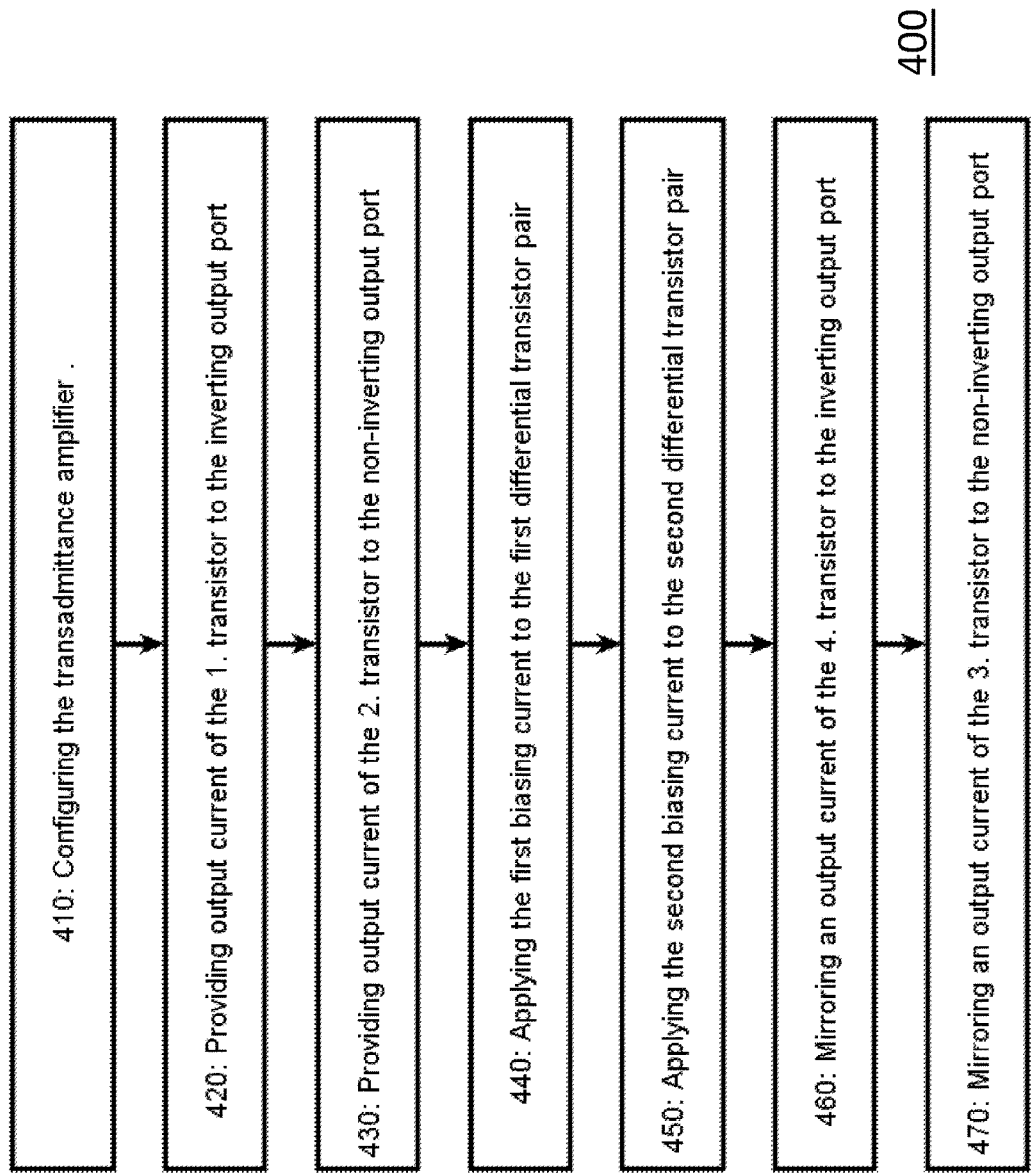
FIG. 4 illustrates a flow chart of method steps of a method for converting a differential input voltage to a differential output current by means of a transadmittance amplifier.

FIG. 4 illustrates a flow chart of method steps of a method for converting a differential input voltage to a differential output current by means of a transadmittance amplifier, e.g. by means of the transadmittance amplifier 100 as described with reference to FIG. 1.

In step 410, the transadmittance amplifier 100 is configured with a predefined ratio of the first current intensity to the second current intensity. In various embodiments, the predefined ratio of the first current intensity to the second current intensity can range between 2 and 8.

In step 420, transadmittance amplifier 100 outputs current from the first transistor to to the inverting output port. In various embodiments, the outputted current in step 420 can be referenced as a first current source.

In step 430, transadmittance amplifier 100 outputs current from the second transistor to the non-inverting output port. In various embodiments, the outputted current in step 430 can be referenced as a second current source.

In step 440, transadmittance amplifier 100 applies the first current source to a first biasing current having a first current intensity to the first differential transistor pair.

In step 450, transadmittance amplifier 100 applies the second current source to a second biasing current having a second current intensity to the second differential transistor pair.

At a step 460, a first current mirror mirrors an output current of the fourth transistor to the inverting output port.

And at a step 470, the second current mirror mirrors an output current of the third transistor to the non-inverting output port.

It should be noted that in operation of the transadmittance amplifier 100, the steps 420 to 470 are executed simultaneously by the transadmittance amplifier 100.

Figure 5:
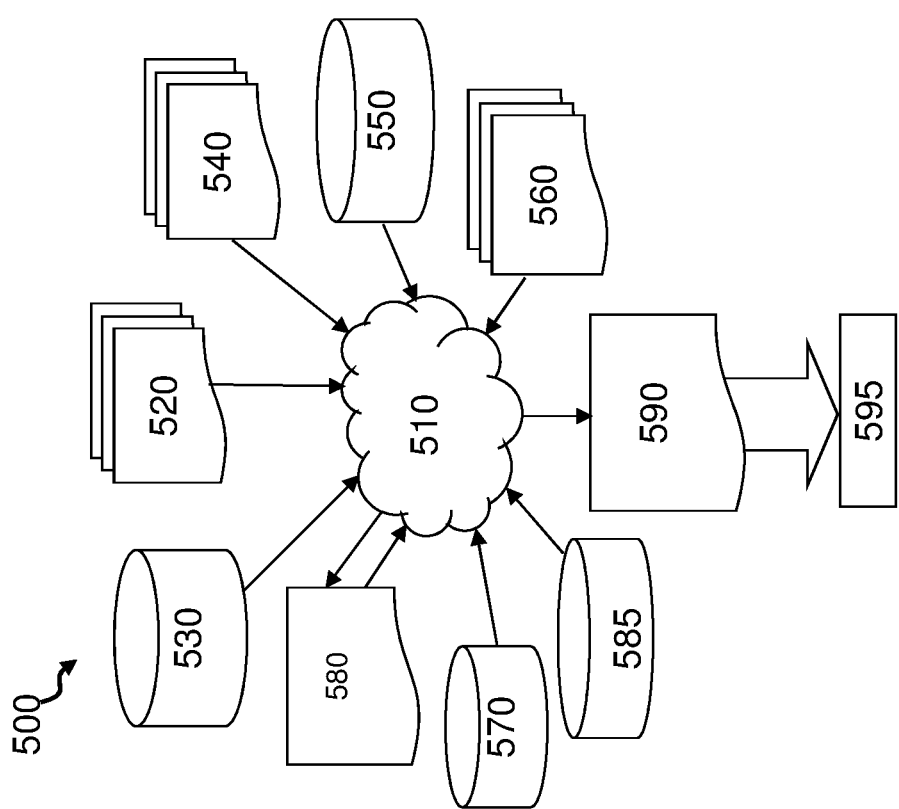
FIG. 5 shows a block diagram of an exemplary design flow used for example, in semiconductor IC logic design, simulation, test, layout, and manufacture.

FIG. 5 shows a block diagram of an exemplary design flow 500 used for example, in semiconductor IC logic design, simulation, test, layout, and manufacture. Design flow 500 includes processes, machines and/or mechanisms for processing design structures or devices to generate logically or otherwise functionally equivalent representations of the design structures and/or devices described above and shown e.g. in FIGS. 1, 2 and 3. The design structures processed and/or generated by design flow 500 can be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines can include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 500 can vary depending on the type of representation being designed. For example, a design flow 500 for building an application specific IC (ASIC) can differ from a design flow 500 for designing a standard component or from a design flow 500 for instantiating the design into a programmable array, for example a programmable gate array (PGA) or a field programmable gate array (FPGA) offered by Altera® Inc. or Xilinx® Inc.

FIG. 5 illustrates multiple such design structures including an input design structure 520 that is preferably processed by a design process 510. Design structure 520 can be a logical simulation design structure generated and processed by design process 510 to produce a logically equivalent functional representation of a hardware device. Design structure 520 can also or alternatively comprise data and/or program instructions that when processed by design process 510, generate a functional representation of the physical structure of a hardware device. Whether representing functional and/or structural design features, design structure 520 can be generated using electronic computer-aided design (ECAD) such as implemented by a core developer/designer. When encoded on a machine-readable data transmission, gate array, or storage medium, design structure 520 can be accessed and processed by one or more hardware and/or software modules within design process 510 to simulate or otherwise functionally represent an electronic component, circuit, electronic or logic module, apparatus, device, or system such as those shown in FIGS. 1, 2 and 3. As such, design structure 520 can comprise files or other data structures including human and/or machine-readable source code, compiled structures, and computer-executable code structures that when processed by a design or simulation data processing system, functionally simulate or otherwise represent circuits or other levels of hardware logic design. Such data structures can include hardware-description language (HDL) design entities or other data structures conforming to and/or compatible with lower-level HDL design languages such as Verilog and VHDL, and/or higher level design languages such as C or C++.

Design process 510 preferably employs and incorporates hardware and/or software modules for synthesizing, translating, or otherwise processing a design/simulation functional equivalent of the components, circuits, devices, or logic structures shown in FIGS. 1, 2 and 3 to generate a Netlist 580 which can contain design structures such as design structure 520. Netlist 580 can comprise, for example, compiled or otherwise processed data structures representing a list of wires, discrete components, logic gates, control circuits, I/O devices, models, etc. that describes the connections to other elements and circuits in an integrated circuit design. Netlist 580 can be synthesized using an iterative process in which netlist 580 is resynthesized one or more times depending on design specifications and parameters for the device. As with other design structure types described herein, netlist 580 can be recorded on a machine-readable data storage medium or programmed into a programmable gate array. The medium can be a non-volatile storage medium such as a magnetic or optical disk drive, a programmable gate array, a compact flash, or other flash memory. Additionally, or in the alternative, the medium can be a system or cache memory, buffer space, or electrically or optically conductive devices and materials on which data packets can be transmitted and intermediately stored via the Internet, or other networking suitable means.

Design process 510 can include hardware and software modules for processing a variety of input data structure types including Netlist 580. Such data structure types can reside, for example, within library elements 530 and include a set of commonly used elements, circuits, and devices, including models, layouts, and symbolic representations, for a given manufacturing technology (e.g., different technology nodes, 32 nm, 45 nm, 90 nm, etc.). The data structure types can further include design specifications 540, characterization data 550, verification data 560, design rules 570, and test data files 585 which can include input test patterns, output test results, and other testing information. Design process 510 can further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 510 without deviating from the scope and spirit of the invention. Design process 510 can also include modules for performing standard circuit design processes such as timing analysis, verification, design rule checking, place and route operations, etc.

Design process 510 employs and incorporates logic and physical design tools such as HDL compilers and simulation model build tools to process design structure 520 together with some or all of the depicted supporting data structures along with any additional mechanical design or data (if applicable), to generate a second design structure 590. Design structure 590 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 520, design structure 590 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1, 2, and 3. In one embodiment, design structure 590 can comprise a compiled, executable HDL simulation model that functionally simulates the devices shown in FIGS. 1, 2 and 3.

Design structure 590 can also employ a data format used for the exchange of layout data of integrated circuits and/or symbolic data format (e.g. information stored in a GDSII (GDS2), GL1, OASIS, map files, or any other suitable format for storing such design data structures). Design structure 590 can comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1, 2 and 3. Design structure 590 can then proceed to a stage 595 where, for example, design structure 590: proceeds to tape-out, is released to manufacturing, is released to a mask house, is sent to another design house, is sent back to the customer, etc.

While the present invention has been described with reference to a limited number of embodiments, variants and the accompanying drawings, it will be understood by those skilled in the art that various changes can be made and equivalents can be substituted without departing from the scope of the present invention. In particular, a feature (device-like or method-like) recited in a given embodiment, variant or shown in a drawing can be combined with or replace another feature in another embodiment, variant or drawing, without departing from the scope of the present invention. Various combinations of the features described in respect of any of the above embodiments or variants can accordingly be contemplated, that remain within the scope of the appended claims. In addition, many minor modifications can be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated.

What is claimed is:

1. A transadmittance amplifier comprising:
  an inverting output port;
  a non-inverting output port;
  a first differential transistor pair comprising:
    a first transistor comprising an inverting input port, wherein the first transistor is configured to provide an output current to the inverting output port; and
    a second transistor comprising a non-inverting input port and being configured to provide an output current to the non-inverting output port;
  a second differential transistor pair comprising:
    a third transistor comprising an inverting input port; and
    a fourth transistor comprising a non-inverting input port;
  a first current source configured to apply a first biasing current having a first current intensity to the first differential transistor pair;
  a second current source configured to apply a second biasing current having a second current intensity to the second differential transistor pair;
  a first current mirror configured to mirror an output current of the fourth transistor to the inverting output port;
  a second current mirror configured to mirror an output current of the third transistor to the non-inverting output port;
  a transadmittance-transimpedance amplifier, wherein the transadmittance-transimpedance amplifier comprises:
    a transimpedance stage, wherein the transimpedance stage comprises:
      a third current source;
      a differential push-pull amplifier comprising a first set of push-pull transistors and a second set of push-pull transistors;
      a pair of feedback resistors comprising a first and a second feedback resistor, wherein the first feedback resistor is coupled between an inverting output port of the transimpedance stage and the inverting output port of the transadmittance amplifier; and
      the second feedback resistor is coupled between a non-inverting output port of the transimpedance stage and the non-inverting output port of the transadmittance amplifier.

2. The transadmittance amplifier of claim 1, wherein the transadmittance amplifier is configured with a predefined ratio of the first current intensity to the second current intensity.

3. The predefined ration of claim 2, wherein the predefined ratio of the first current intensity to the second current intensity is in a range between 2 and 8.

4. The transadmittance amplifier of claim 2, wherein
  the current intensity of the second biasing current is a fraction 1/N of the current intensity of the first biasing current, wherein N is a real number;
  a transconductance value $g_{m2}$ of the third and the fourth transistor is a fraction 1/N of a transconductance value $g_{m1}$ of the first and the second transistor; and
  the first and the second current mirror are configured to mirror the output current of the fourth and the third transistor respectively with a mirror ratio of 1:N.

5. The transadmittance amplifier of claim 1, wherein the first, the second, the third and the fourth transistor are embodied as field effect transistors.

6. The transadmittance amplifier of claim 5, wherein
  the source of the first transistor and the source of the second transistor are coupled to each other;
  the first current source is coupled to the source of the first transistor and to the source of the second transistor;
  the second current source is coupled to the source of the third transistor and to the source of the fourth transistor;
  the drain of the first transistor and the drain of the fourth transistor are coupled via the first current mirror the each other;
  the drain of the second transistor and the drain of the third transistor are coupled via the second current mirror the each other;
  the drain of the first transistor is coupled to the inverting output port and the drain of the second transistor is coupled the non-inverting output port;
  the gate of the first transistor forms the inverting input port of the first transistor;
  the gate of the second transistor forms the non-inverting input port of the second transistor;
  the gate of the third transistor forms the inverting input port of the third transistor; and
  the gate of the fourth transistor forms the non-inverting input port of the fourth transistor.

7. The transadmittance amplifier of claim 1, wherein the transadmittance amplifier is a variable gain amplifier.

8. The transadmittance amplifier of claim 6, wherein first current source and the second current source are programmable current sources to program the gain of the variable gain amplifier.

9. The transadmittance-transimpedance amplifier of claim 1, wherein the first and the second feedback resistor are tunable to tune a driving capability of the transadmittance-transimpedance amplifier.

10. The transadmittance-transimpedance amplifier of claim 1, further comprising:
an optical receiver, comprising:
a transadmittance-transimpedance amplifier according to claim 1;
a photodiode;
a transimpedance amplifier arranged between the photodiode and the input of the transadmittance-transimpedance amplifier; and
a digital feedback equalizer being configured to receive a differential output signal of the transadmittance-transimpedance amplifier.

11. A design structure tangibly embodied in a machine readable medium for designing, manufacturing, or testing an integrated circuit, the design structure comprising:
an inverting output port;
a non-inverting output port;
a first differential transistor pair having
a first transistor comprising an inverting input port and being configured to provide an output current to the inverting output port;
a second transistor comprising a non-inverting input port and being configured to provide an output current to the non-inverting output port;
a second differential transistor pair having
a third transistor comprising an inverting input port; and
a fourth transistor comprising a non-inverting input port;
a first current source configured to apply a first biasing current having a first current intensity to the first differential transistor pair;
a second current source configured to apply a second biasing current having a second current intensity to the second differential transistor pair;
a first current mirror configured to mirror an output current of the fourth transistor to the inverting output port;
a second current mirror configured to mirror an output current of the third transistor to the non-inverting output port;
a transadmittance-transimpedance amplifier, wherein the transadmittance-transimpedance amplifier comprises:
a transimpedance stage, wherein the transimpedance stage comprises:
a third current source;
a differential push-pull amplifier comprising a first set of push-pull transistors and a second set of push-pull transistors;
a pair of feedback resistors comprising a first and a second feedback resistor, wherein the first feedback resistor is coupled between an inverting output port of the transimpedance stage and the inverting output port of the transadmittance amplifier; and
the second feedback resistor is coupled between a non-inverting output port of the transimpedance stage and the non-inverting output port of the transadmittance amplifier.

12. The design structure of claim 11, wherein the transadmittance amplifier is configured with a predefined ratio of the first current intensity to the second current intensity.

13. The design structure of claim 11, wherein the predefined ratio of the first current intensity to the second current intensity is in a range between 2 and 8.

14. The design structure of claim 11, wherein
the current intensity of the second biasing current is a fraction 1/N of the current intensity of the first biasing current, wherein N is a real number;
a transconductance value $g_{m2}$ of the third and the fourth transistor is a fraction 1/N of a transconductance value $g_{m1}$ of the first and the second transistor; and
the first and the second current mirror are configured to mirror the output current of the fourth and the third transistor respectively with a mirror ratio of 1:N.

15. The design structure of claim 11, wherein the first, the second, the third and the fourth transistor are embodied as field effect transistors.

* * * * *